(12) United States Patent  (10) Patent No.: US 8,883,627 B2
Shi et al.  (45) Date of Patent: Nov. 11, 2014

(54) METHOD FOR CHIP PACKAGING

(75) Inventors: Lei Shi, Jiangsu (CN); Guohua Gao, Jiangsu (CN); Yujuan Tao, Jiangsu (CN); Naomi Masuda, Jiangsu (CN); Koichi Meguro, Jiangsu (CN)

(73) Assignee: Nantong Fujitsu Microelectronics Co., Ltd., Nantong, Jiangsu (CN)

( * ) Notice: Subject to any disclaimer, the term of this patent is extended or adjusted under 35 U.S.C. 154(b) by 0 days.

(21) Appl. No.: 13/883,231

(22) PCT Filed: Oct. 18, 2011

(86) PCT No.: PCT/CN2011/080874
§ 371 (c)(1),
(2), (4) Date: Jul. 12, 2013

(87) PCT Pub. No.: WO2012/059003
PCT Pub. Date: May 10, 2012

(65) Prior Publication Data
US 2013/0280904 A1  Oct. 24, 2013

(30) Foreign Application Priority Data
Nov. 5, 2010  (CN) .......................... 2010 1 0534388

(51) Int. Cl.
*H01L 21/44* (2006.01)
*H01L 21/768* (2006.01)
(Continued)

(52) U.S. Cl.
CPC .......... *H01L 21/76885* (2013.01); *H01L 21/78* (2013.01); *H01L 23/3178* (2013.01); *H01L*
(Continued)

(58) Field of Classification Search
None
See application file for complete search history.

(56) References Cited

U.S. PATENT DOCUMENTS 5,811,351 A  9/1998  Kawakita et al.
6,689,639 B2  2/2004  Sakuyama et al.
(Continued)

FOREIGN PATENT DOCUMENTS

CN  1420527 A  5/2003
CN  1949491 A  4/2007
(Continued)

OTHER PUBLICATIONS

International Search Report and Written Opinion issued by the State Intellectual Property Office, the P.R. China (in Chinese language) dated Dec. 31, 2011, for related International Application No. PCT/CN2011/080874; 10 pages.

(Continued)

*Primary Examiner* — Sonya D McCall Shepard
(74) *Attorney, Agent, or Firm* — Faegre Baker Daniels LLP

(57) ABSTRACT

Provided is a method for chip packaging, including the steps of: providing a semi-packaged wafer which has a cutting trail and a metal bonding pad of the chip; forming a first protective layer on the cutting trail; forming on the metal bonding pad a sub-ball metal electrode; forming a solder ball on the sub-ball metal electrode; dicing the wafer along the cutting trail. The first protective layer according to the present invention can prevent the metal in the cutting trail from being separated by electroplating, and protect the lateral sides of a discrete chip after cutting. The process flow thereof is simple, and enhances the efficiency of the packaging as well as its yield.

20 Claims, 14 Drawing Sheets

(51) Int. Cl.
    *H01L 21/78*     (2006.01)
    *H01L 23/31*     (2006.01)
    *H01L 21/56*     (2006.01)
    *H01L 23/00*     (2006.01)

(52) U.S. Cl.
    CPC .. 21/561 (2013.01); *H01L 23/3114* (2013.01); *H01L 24/11* (2013.01); *H01L 2224/03462* (2013.01); *H01L 2224/0347* (2013.01); *H01L 2224/0401* (2013.01); *H01L 2224/05572* (2013.01); *H01L 2224/05644* (2013.01); *H01L 2224/05655* (2013.01); *H01L 2224/1147* (2013.01); *H01L 2224/94* (2013.01); *H01L 2924/01013* (2013.01); *H01L 2924/01029* (2013.01); *H01L 2924/0103* (2013.01); *H01L 2924/01033* (2013.01); *H01L 2924/01047* (2013.01); *H01L 2924/01079* (2013.01); *H01L 2924/01082* (2013.01); *H01L 2924/01006* (2013.01); *H01L 2924/01023* (2013.01); *H01L 2924/01024* (2013.01); *H01L 2924/01074* (2013.01); *H01L 2924/014* (2013.01); *H01L 24/03* (2013.01); *H01L 24/05* (2013.01); *H01L 24/13* (2013.01); *H01L 2224/05022* (2013.01); *H01L 2224/13111* (2013.01)
    USPC ................ 438/613; 257/459; 257/E23.021

(56) References Cited

U.S. PATENT DOCUMENTS

| | | | |
|---|---|---|---|
| 7,270,402 B2 | 9/2007 | Sakaida et al. | |
| 7,468,544 B2 | 12/2008 | Yang | |
| 7,495,332 B2 | 2/2009 | Kariya et al. | |
| 7,549,914 B2 | 6/2009 | Ladjias | |
| 7,566,944 B2 | 7/2009 | Wang et al. | |
| 7,645,514 B2 | 1/2010 | Watanabe et al. | |
| 7,727,877 B2 | 6/2010 | Kang et al. | |
| 7,838,424 B2 | 11/2010 | Karta et al. | |
| 7,888,236 B2 | 2/2011 | Pu et al. | |
| 8,314,495 B2 | 11/2012 | Hayashi et al. | |
| 2002/0001670 A1* | 1/2002 | Pauw et al. | 427/98 |
| 2003/0104698 A1* | 6/2003 | Taniguchi et al. | 438/692 |
| 2004/0164385 A1* | 8/2004 | Kado et al. | 257/678 |
| 2008/0136026 A1* | 6/2008 | Yang | 257/738 |
| 2008/0169477 A1 | 7/2008 | Wang et al. | |
| 2008/0191349 A1 | 8/2008 | Aoki | |
| 2008/0318413 A1* | 12/2008 | Fillion et al. | 438/637 |
| 2009/0215227 A1 | 8/2009 | Tan et al. | |
| 2009/0283499 A1* | 11/2009 | Mayer et al. | 216/90 |

FOREIGN PATENT DOCUMENTS

| | | |
|---|---|---|
| CN | 101131915 A | 2/2008 |
| CN | 101197336 | 6/2008 |
| CN | 101221939 A | 7/2008 |
| CN | 101290892 A | 10/2008 |
| CN | 101308813 A | 11/2008 |
| CN | 101339910 A | 1/2009 |
| CN | 101814445 A | 8/2010 |
| CN | 102034720 A | 4/2011 |
| CN | 102034721 A | 4/2011 |

OTHER PUBLICATIONS

English translation of the International Search Report issued by the State Intellectual Property Office, the P.R. China, dated Dec. 31, 2011, for related International Application No. PCT/CN2011/080874; 2 pages.

International Search Report and Written Opinion issued by the State Intellectual Property Office, the P.R. China (in Chinese language) dated Dec. 31, 2011, for related International Application No. PCT/CN2011/080875; 10 pages.

English translation of the International Search Report issued by the State Intellectual Property Office, the P.R. China, dated Dec. 31, 2011, (date of mailing Jan. 19, 2012), for related International Application No. PCT/CN2011/080875; 2 pages.

English translation of the Written Opinion of the International Searching Authority, State Intellectual Property Office, the P.R. China, Dec. 31, 2011, for International Application No. PCT/CN2011/080874; 12 pages.

International Preliminary Report on Patentability (in Chinese language), The International Bureau of WIPO, dated May 7, 2013, for International Application No. PCT/CN2011/080874; 8 pages (includes cover page In English language).

English translation of the International Preliminary Report on Patentability, The International Bureau of WIPO, dated May 8, 2013, for International Application No. PCT/CN2011/080874; 13 pages.

English translation of the Written Opinion of the International Searching Authority, State Intellectual Property Office, the P.R. China, Dec. 31, 2011 (date of mailing Feb. 16, 2012), for related International Application No. PCT/CN2011/080875; 13 pages.

International Preliminary Report on Patentability (in Chinese language), The International Bureau of WIPO, dated May 7, 2013, for related International Application No. PCT/CN2011/080875; 8 pages (includes cover page in English language).

English translation of the International Preliminary Report on Patentability, The International Bureau of WIPO, dated May 8, 2013, for related International Application No. PCT/CN2011/080875; 14 pages.

Zhao et al., "Threshold Pressure and its influence in chemical mechanical polishing for IC fabrication," 1998 International Electron Devices Meeting, IEDM '98 Technical Digest, pp. 341-344; 4 pages.

* cited by examiner

METHOD FOR CHIP PACKAGING

CROSS REFERENCE TO RELATED APPLICATIONS

The present application is a Section 371 National Stage Application of International Application No. PCT/CN2011/080874, filed on May 19, 2011, which claims priority to Chinese patent application No. 201010534388.5, filed on Nov. 5, 2010, and entitled "Method for Chip Packaging", the entire disclosure of which is incorporated herein by reference.

FIELD OF THE DISCLOSURE

The present disclosure relates to semiconductor technology, and more particularly, to a method for chip packaging in wafer level.

BACKGROUND OF THE DISCLOSURE

By employing Wafer-level-chip-size-packaging (WLCSP) technology, a whole wafer may be diced into separated chips after it is packaged and tested. The packaged chip may have dimensions exactly the same as its dimensions before being packaged. WLCSP has revolutionized conventional packaging modes using, for example, ceramic leadless chip carriers or organic leadless chip carriers, and complies with the increasing requirements for lighter, smaller, shorter, thinner and cheaper microelectronic product. Chips packaged using WLCSP may have highly minimized dimensions. Manufacturing costs of chips may be tremendously reduced with the reduction of chip size and upsizing of wafers. WLCSP enables the integration of IC design, wafer manufacturing, packaging and testing, thereby becomes a hot spot in current packaging field and a feature trend.

Chinese patent application No. 200610096807.5 discloses a packaging method based on WLCSP, mainly including steps as follows.

As shown FIG. 1, a semiconductor wafer 1 is adhered with a first glass substrate 2. The semiconductor wafer 1 and the first glass substrate 2 may have the same dimensions. Therefore, devices formed on a surface of the semiconductor wafer 1 is covered and protected by the first glass substrate 2 during an initial stage of the packaging, thereby reducing external pollutions and damages.

As shown in FIG. 2, the semiconductor wafer 1 is thinned from its hack side which is opposite to the first glass substrate 2. By employing a lithographic process and a plasma etching process to selectively etch the wafer from the back side, a plurality of V-shaped grooves to be used as cutting trails are formed, partially exposing chip bonding pads 11 (i.e., chip electrodes).

As shown in FIG. 3, the V-shaped grooves are filled with an insulation material. Further, a second glass substrate 3 and a solder mask 4 are pressed and adhered onto the backside of the wafer. The second glass substrate 3 is used to support the semiconductor wafer 1. The solder mask 4 featured with electric and thermal insulation is used to provide mechanical buffer in a following mechanical slicing process, thereby protecting the semiconductor wafer 1.

As shown in FIG. 4, a mechanical slicing process is performed at the V-shaped grooves' former positions without separating the chips, thus new V-shaped grooves used as slicing trails of the wafer are formed. Besides, the chip bonding pads 11 are exposed from sidewalls of the new V-shaped grooves.

As shown in FIG. 5, external leads 12 are formed using electroplating technology. Each of the external leads 12 has one end connected with the chip bonding pads 11 in the new V-shaped grooves, and the other end extending to the back side of the wafer. In such ways, the chip bonding pads 11 are electrically connected to the back side of the wafer through the external leads 12.

As shown FIG. 6, an insulation protecting layer 14 is selectively formed on the back side of the wafer, where the external leads 12 are partially exposed. Soldering bumps 15 are formed on the exposed external leads 12. The wafer is sliced along the new V-shaped grooves on its back side, thereby forming separated chips. Thereafter, the separated chips are packaged in shells to complete the packaging.

Current WLCSP methods have following drawbacks. During the formation of the external leads 12 using the electroplating process, metal may be precipitated from the slicing trails (e.g., the V-shaped grooves described above) due to the electroplating processes. As a result, short circuit failure may occur between connecting lines. Furthermore, sidewalls of the separated chips, i.e., the sidewalls of the V-shaped grooves, are exposed to the outer environment, where damages may occur during the shell packaging. As a result, external leads may be broken, and the chip yield may be affected.

BRIEF SUMMARY OF THE DISCLOSURE

Embodiments of the present disclosure provide a method for chip packaging to improve packaging efficiency and yield.

Embodiments of the present disclosure provide a method for chip packaging, including:
  providing a semi-packaged wafer, where slicing trails and metal bonding pads of chips are formed on the semi-packaged wafer;
  forming sub-ball metal electrodes on the metal bonding pads;
  forming solder balls on the sub-ball metal electrodes; and
  slicing the wafer along the slicing trails;
  further including forming a first protective layer in the slicing trails.

Optionally, the first protective layer has a width larger than that of the slicing trails, the width of the slicing trails ranges from about 30 μm to about 80 μm, and the width of the first protective layer ranges from about 50 μm to about 120 μm.

Optionally, the first protective layer includes thermosetting epoxy resin and is formed using a screen printing process.

Optionally, the sub-ball metal electrodes are formed using an electrolyte less plating process. The electrolyte less plating process includes: washing a surface of the wafer with zincate; and electrolyte less plating Ni on the wafer followed by electrolyte less plating Au, where Ni has an electroplating thickness of about 3 μm, and Au has an electroplating thickness of about 0.05 μm.

Optionally, the sub-ball metal electrodes are formed using a selective vapor deposition process.

Optionally, the selective vapor deposition includes: disposing a mask plate on the wafer, where the mask plate exposes positions on the wafer where the sub-ball metal electrodes are to be formed; and depositing Ni and Cu successively on the wafer using a physical vapor deposition process with the mask plate as a mask.

Optionally, the method further includes: after the sub-ball metal electrodes are formed, forming a second protective layer on the wafer except regions of the sub-ball metal electrodes, where the second protective layer has a thickness ranging from about 5 μm to about 50 μm.

Optionally, the second protective layer includes thermosetting epoxy resin and is formed using a screen printing process, where the wafer is maintained at a temperature lower than a curing temperature of the thermosetting epoxy resin during the screen priming process. The method further includes: after the second protective layer is formed, removing the thermosetting epoxy resin on top of the sub-ball metal electrodes using a plasma etching process.

Optionally, the method further includes: after the second protective layer is formed, performing a polishing process to the wafer.

The polishing process includes: placing the wafer on a fixed operating platform; winding a non-woven softer than the wafer around a polishing head, and tightly attaching the non-woven onto the wafer; and dipping the non-woven with a polishing solution and mechanically polishing the wafer.

Optionally, the curing temperature of the thermosetting epoxy resin is less than 200° C.

Optionally, the thermosetting epoxy resin includes a solidified filler having particles with a particle diameter less than ⅓ of a printing thickness of the thermosetting epoxy resin.

Optionally, the printing thickness of the thermosetting epoxy resin is about 15 µm, the particle diameter of the solidified fillers is less than about 5 µm, and the second protective layer formed after the curing has an average thickness ranging from about 11 µm to about 12 µm.

Optionally, the wafer is subjected to a backing process or a plasma processing process to activate the surface of the wafer before the screen printing process.

In the chip packaging method provided by embodiments of the present disclosure, the first protective layer is formed in the slicing trails. Specifically, thermosetting epoxy resin may be selected as the material of the protective layer. On the one hand, metal may not be separated out from the slicing trails during the electroplating process for forming the sub-ball metal electrodes, on the other hand, sidewalls of individual chips may be protected, especially metal wires may not be damaged. Embodiments of the present disclosure have simple processes and low costs, increase packaging efficiency and yield.

BRIEF DESCRIPTION OF THE DRAWINGS

The above described and other features and advantages will become more apparent to those of ordinary skill in the art by describing in detail exemplary embodiments with reference to the attached drawings. The same reference numbers may be used in different drawings to identify the same or similar elements. The figures are not drawn to scale, and it is noted that the drawings are provided for illustrative purposes only.

DETAILED DESCRIPTION OF THE DISCLOSURE

In existing WLCSP methods, metal is likely to be precipitated from slicing trails during formation of sub-ball metal electrodes, thus short circuit failure may occur. Besides, after the wafer is sliced, sidewalls of separated chips are exposed to outer environment and are likely to be damaged. In embodiments of the present disclosure, a first protective layer is formed in the slicing trails using a screen printing process to address the above drawbacks. Embodiments of the present disclosure will be illustrated in detail hereinafter with reference to accompanying drawings.

Figure 1:
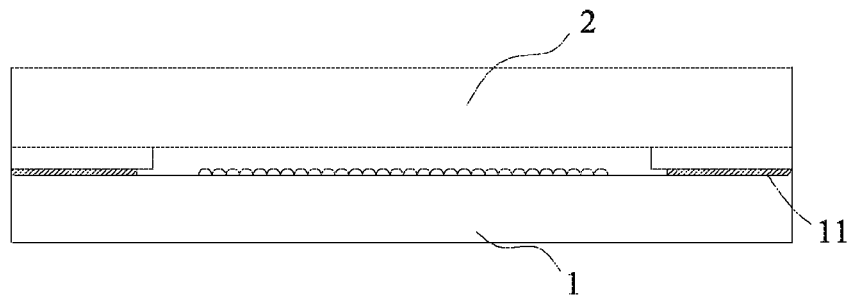
FIGS. 1 to 6 schematically illustrate cross-sectional views of intermediate structures formed in a conventional WLCSP process.
Figure 2:
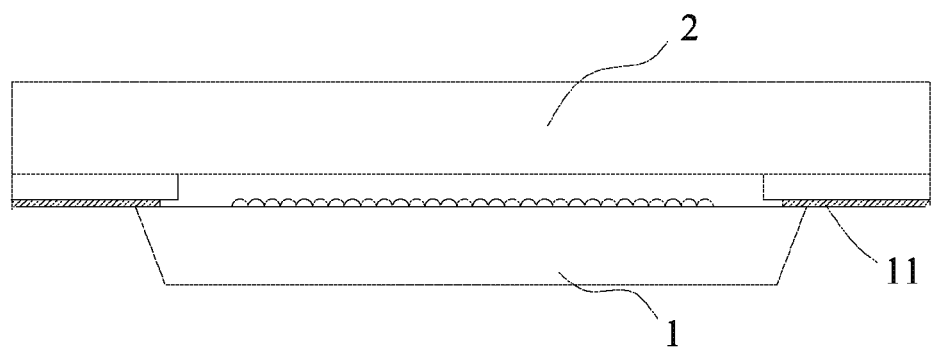
Figure 3:
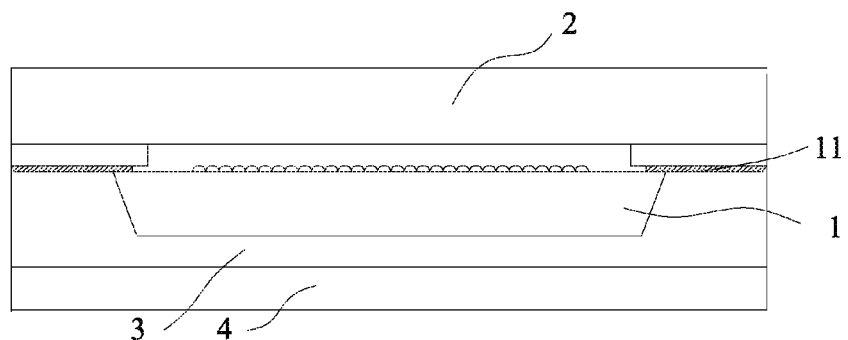
Figure 4:
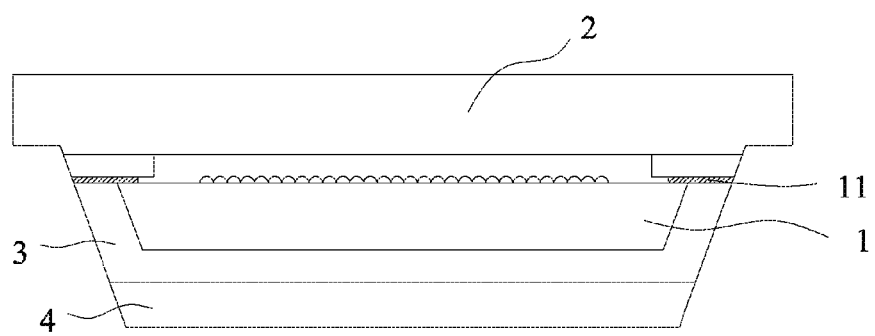
Figure 5:
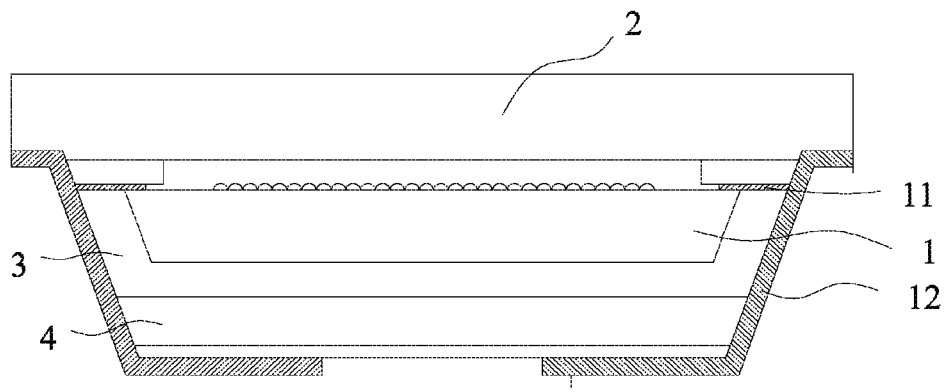
Figure 6:
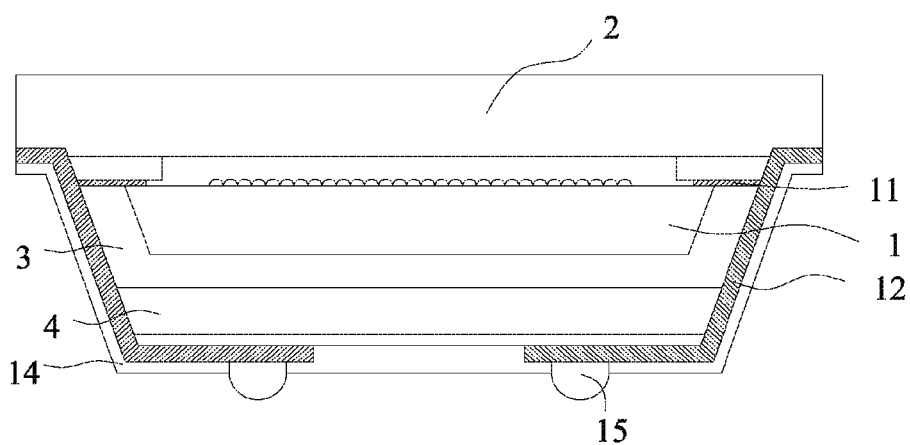
Figure 7:
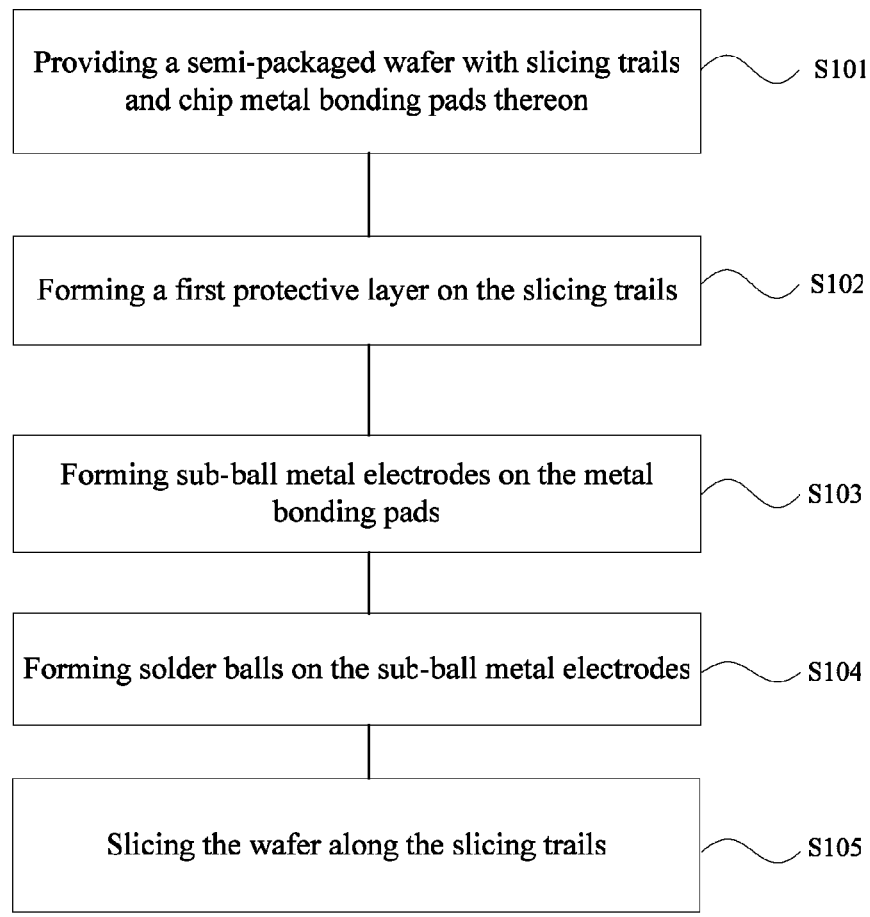
FIG. 7 schematically illustrates a flow chart of a packaging process according to one embodiment of the present disclosure.

According to one embodiment, a packaging process is provided, processing steps of which are schematically illustrated in FIG. 7, including:

S101, providing a semi-packaged wafer. Specifically, the semi-packaged wafer includes: a semiconductor substrate with chips formed thereon, slicing trails which divides the wafer into a plurality of chip units, a protective mask on the semiconductor substrate to provide insulation and protection, where the protective mask has openings exposing metal bonding pads of the chips. The protective mask may be an organic membrane including polyimide, or the like. The metal bonding pads may include a conventional interconnection metal material, such as Cu, Al, or the like.

S102, forming a first protective layer in the slicing trails. Specifically the first protective layer may be printed onto the slicing trails using a screen printing process.

Preferably, the first protective layer may have a width larger than that of the slicing trails. Therefore, after the slicing, the individual chips may have protection on sidewalls and top edges thereof. To reduce the difficulty of the formation process, the first protective layer may include thermosetting resin, such as epoxy resin, phenolic resin, pollopas, melamine-formaldehyde resin, unsaturated polymer resin, polyurethane, polyimide, or the like.

S103, forming sub-ball metal electrodes on the metal bonding pads.

The sub-ball metal electrodes may be formed in the openings of the protective mask and on the metal bonding pads using electroplating or selective vapor deposition. An electrolyte less plating process may be used to improve the uniformity of the electroplating, while selective vapor deposition may reduce the cost since a same metal mask board may be repeatedly used. The sub-ball metal electrodes normally include Ni, Au, Cu, Al, Ti, W, Cr, or a combination thereof. The material of the sub-ball metal electrodes may be selected based on the required thickness thereof, thereby meeting requirements of costs and processing conditions.

In order to further improve the protection to the wafer and the packaging yield, after the formation of the sub-ball metal electrodes, a second protective layer may be formed on the wafer using screen printing. The second protective layer may have a thermosetting resin material identical with the first protective layer. Specific position of the second protective layer may be determined by adjusting opening regions of a printing plate used in the screen printing process. After the formation of the second protective layer, normally a plasma etching process is performed to remove a portion of the second protective layer disposed on top of the sub-ball metal electrodes due to the fluidity of the thermosetting resin during the screen printing. And the wafer surface is processed with a polishing process to expose the top of the sub-ball metal electrodes, which may facilitate subsequent solder ball formation.

S104, forming solder balls on the sub-ball metal electrodes. Solder material may be coated on the top of the sub-ball metal electrodes, and a high temperature reflow process may be performed to form the solder balls. The common solder material may include Sn, Pb, Ag, Cu, Zn, and the like, or a combination thereof.

S105, slicing the wafer along the slicing trails to form individual chips.

Normally the wafer may be mechanically sliced using a blade with a width less than the slicing trails. In some embodiments, laser slicing may be used. After the slicing, the individual chips may have the first protective layer covered on sidewalls and top edges thereof, which may protect metal wires from damages in subsequent packaging processes.

In order to clarify the advantages of the present disclosure, three exemplary embodiments will be illustrated with reference to accompanying drawings of the present disclosure.

First Exemplary Embodiment

Figure 8:
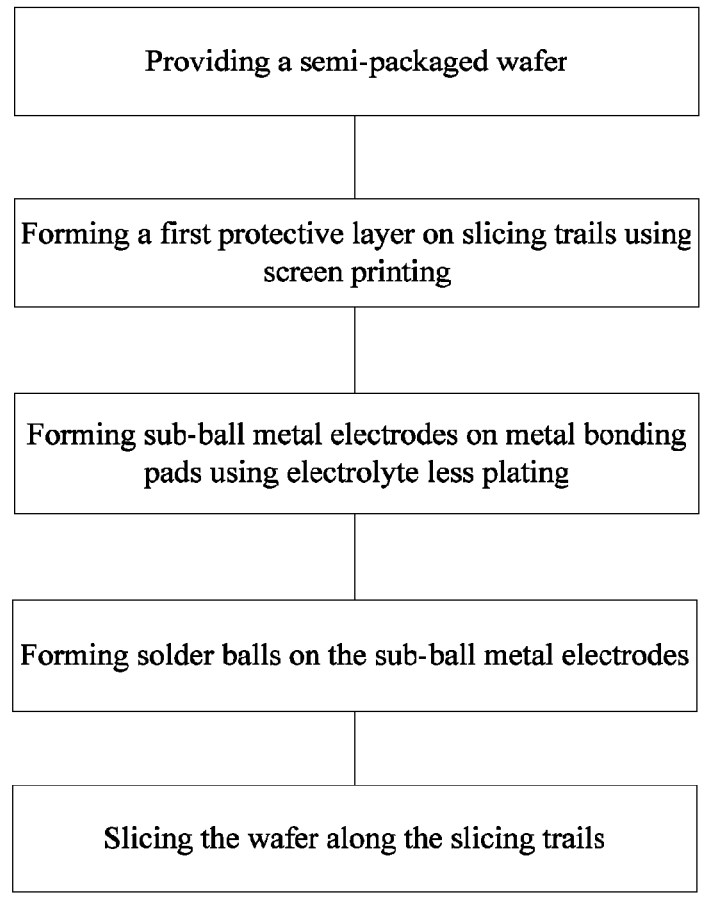
FIG. 8 schematically illustrates a flow chart of a packaging process according to a first exemplary embodiment of the present disclosure.

FIG. 8 schematically illustrates a flow chart of a packaging process according to a first exemplary embodiment of the present disclosure. FIGS. 9 to 16 are cross-sectional views of intermediate structures formed in the packaging process. Processing steps will be further illustrated in detail with reference to FIG. 8.

Figure 9:
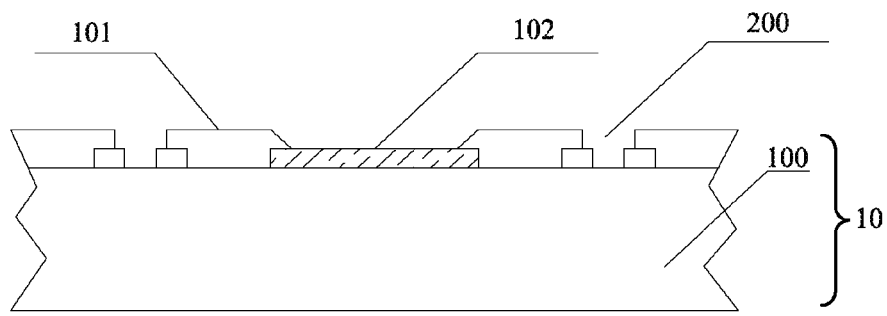
FIGS. 9, 11, 13, 14, 15 and 16 schematically illustrate cross-sectional views of intermediate structures formed in a packaging process illustrated in FIG. 8.

As shown in FIG. 9, a semi-packaged wafer 10 is provided, including: a semiconductor substrate 100 with a plurality of chips formed thereon, a plurality of slicing trails 200 which isolate the wafer into a plurality of individual chip units and a protective mask 101 on the semiconductor substrate 100, where the protective mask 101 has openings exposing metal bonding pads 102 of the chips. The protective mask 101 may be an organic membrane including polyimide, or the like. The metal bonding pads 102 may include a conventional interconnection metal material, such as Cu, Al, or the like.

It should be noted that, the above described semiconductor substrate 100 may not be limited to a monatomic silicon or a silicon-on-insulator substrate. The semiconductor substrate 100 may further include components such as semiconductor devices, metal interconnection structures and other semiconductor components formed thereon. The protective mask 101 is formed on surfaces of the components to protect the chips. The metal bonding pads 102 of the chips are used as input/output electrodes of the chips to lead out electrical properties of the chips.

Figure 10:
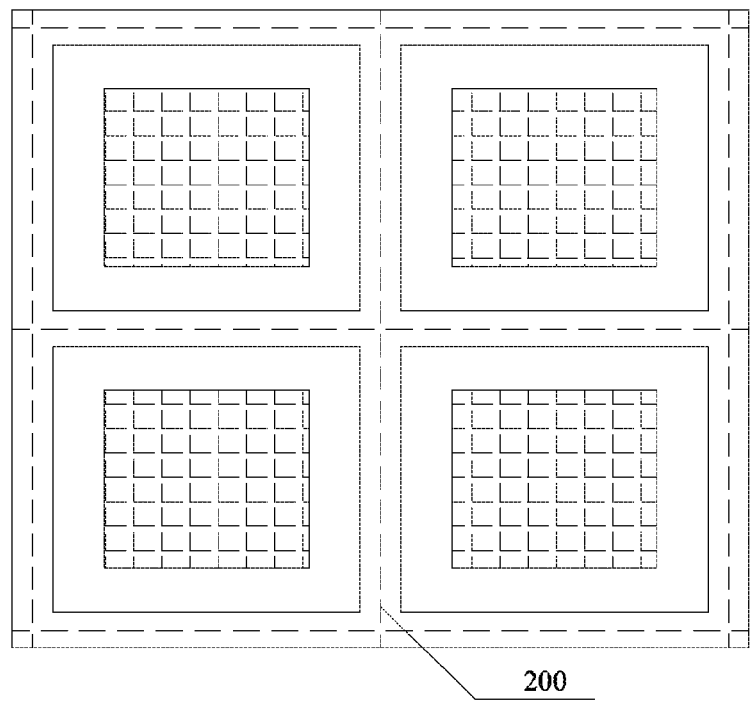
FIG. 10 is a top view of FIG. 9.

FIG. 10 is a top view of the semi-packaged wafer. It could be seen that slicing trails 200 arranged with a grid structure are formed on the wafer to isolate the wafer into a plurality of square regions, where each square region may represent an individual chip. The slicing trails 200 may have an isosceles trapezoid sectional shape and a not too great depth to avoid affecting the wafer rigidity. In some embodiments, the openings of the slicing trails 200 have a width ranging from about 30 µm to about 80 µm.

Figure 11:
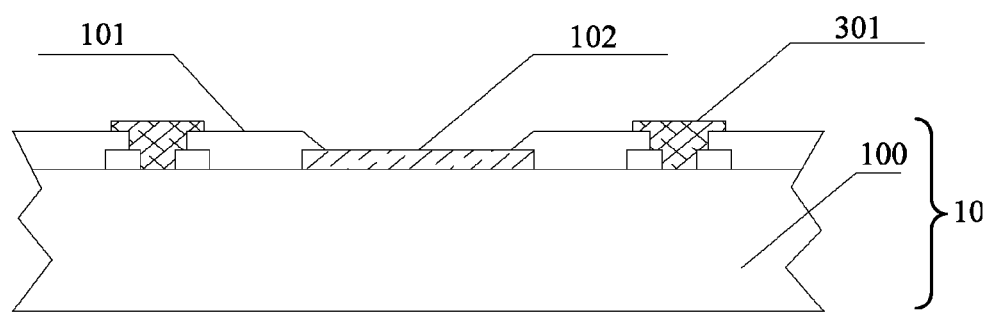
Figure 12:
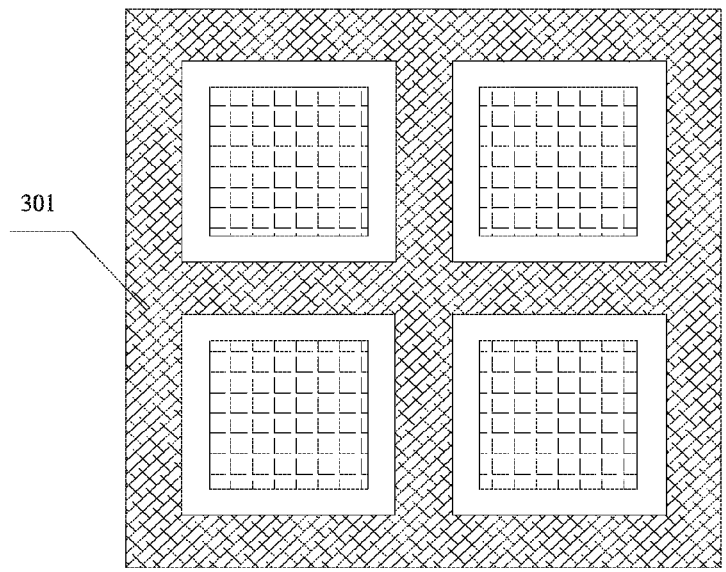
FIG. 12 is a top view of FIG. 11.

FIG. 11 is a cross-sectional view of the semi-packaged wafer, and FIG. 12 is a top view of FIG. 11. As shown in FIGS. 11 and 12, a first protective layer 301 is formed in the slicing trails 200 by performing a screen printing process to the semi-packaged wafer surface. The first protective layer 301 may include one of the thermosetting resins described above. In some embodiment, in order to reduce the cost, the first protective layer 301 preferably includes thermosetting epoxy resin. By adjusting positions of openings of a print plate used in the screen printing process, the first protective layer 301 may be formed at a selected position.

Figure 13:
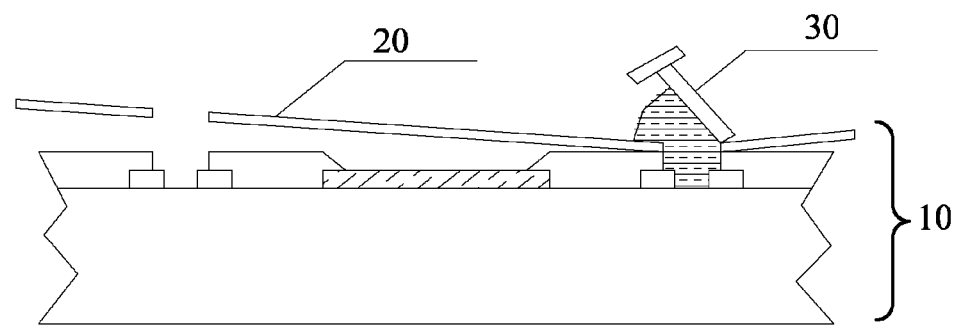

Specifically, FIG. 13 schematically illustrates the screen printing process, including: fixing the wafer 10 in a printing device and below a printing plate 20; coating the printing plate 20 with liquid epoxy resin; pressing the printing plate 20 to the wafer 10 with a scraper 30, so as to coat the surface of the wafer 10 with the liquid epoxy resin through openings of the printing plate 20; and then peeling the printing plate 20 from the wafer 10, so that the liquid epoxy resin is transferred to the wafer 10 to form a desired pattern.

During the screen printing, the openings of the printing plate 20 are aligned with the slicing trails 200 on the wafer 10. Therefore, the liquid epoxy resin is filled into the slicing trails 200 after penetrating into the wafer 10. The wafer 10 is then heated to a curing temperature to solidify the liquid epoxy resin, thereby forming the first protective layer 301. Furthermore, in order to ensure that the first protective layer 301 has a width larger than that of the slicing trails 200, it is required that the openings of the printing plate 20 are wider than the slicing trails 200. In some embodiments, the width of the first protective layer 301 is configured to range from about 50 µm to about 120 µm.

Figure 14:
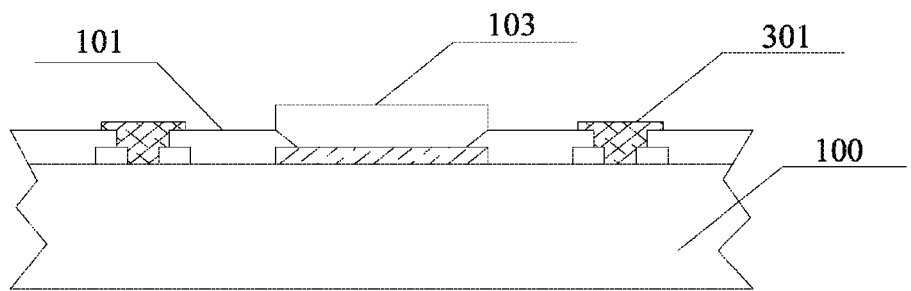

As shown in FIG. 14, by using an electrolyte less plating process, sub-ball metal electrodes 103 are formed on the metal bonding pads 102 with the first protective layer 301 and the protective mask 101 as an electroplating mask.

Specifically, in some embodiments, the metal bonding pads 102 are preprocessed with zincate before the electroplating process, so that oxide films disposed thereon may be removed and thus contact resistance may be reduced. Thereafter, Ni and Au are successively electroplated on the metal bonding pads 102 without electrolyte, where Ni has a thickness of about 3 µm and Au has a thickness of about 0.05 µm. Therefore, the sub-ball metal electrodes 103 protruding from the protective mask 101 are formed.

Figure 15:
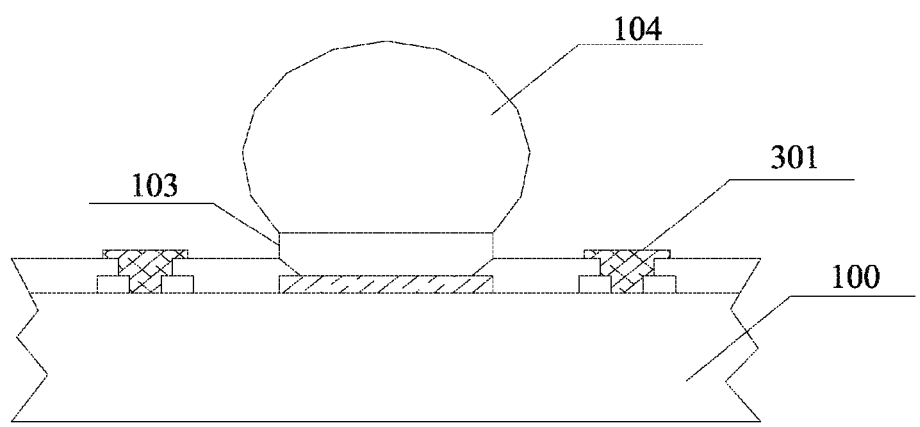

As shown in FIG. 15, solder balls 104 are formed on top of the sub-ball metal electrodes 103 using a solder reflow process. In some embodiments, to reduce the cost, Sn is used as the solder material. Specifically, Sn solder is coated on the sub-ball metal electrodes 103, and a high temperature reflow process is performed to the solder, so that the Sn solder is transformed into the solder balls 104. Normally, to maintain the flatness of other parts of the wafer and enhance insulation protection, an underfill process may be performed to the wafer surface other than the solder balls 104.

Figure 16:
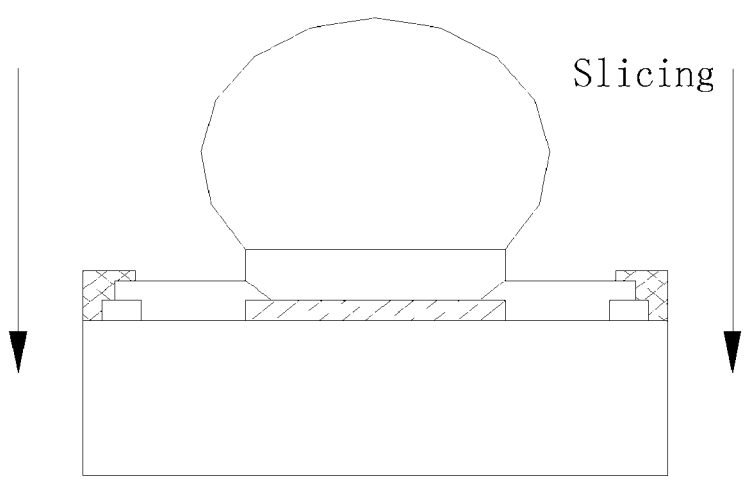

As shown in FIG. 16, after the formation of the solder balls, the wafer 10 is sliced along the slicing trails 200 to form individual chips. Specifically, a dicing blade having width less than the width of the first protective layer 301 is used to mechanically slice the wafer 10. In such ways, the individual chips may have the continuous first protective layer 301 on its sidewalls and top edges, and metal leads and other semiconductor components at these positions can be effectively protected.

Second Exemplary Embodiment

Figure 17:
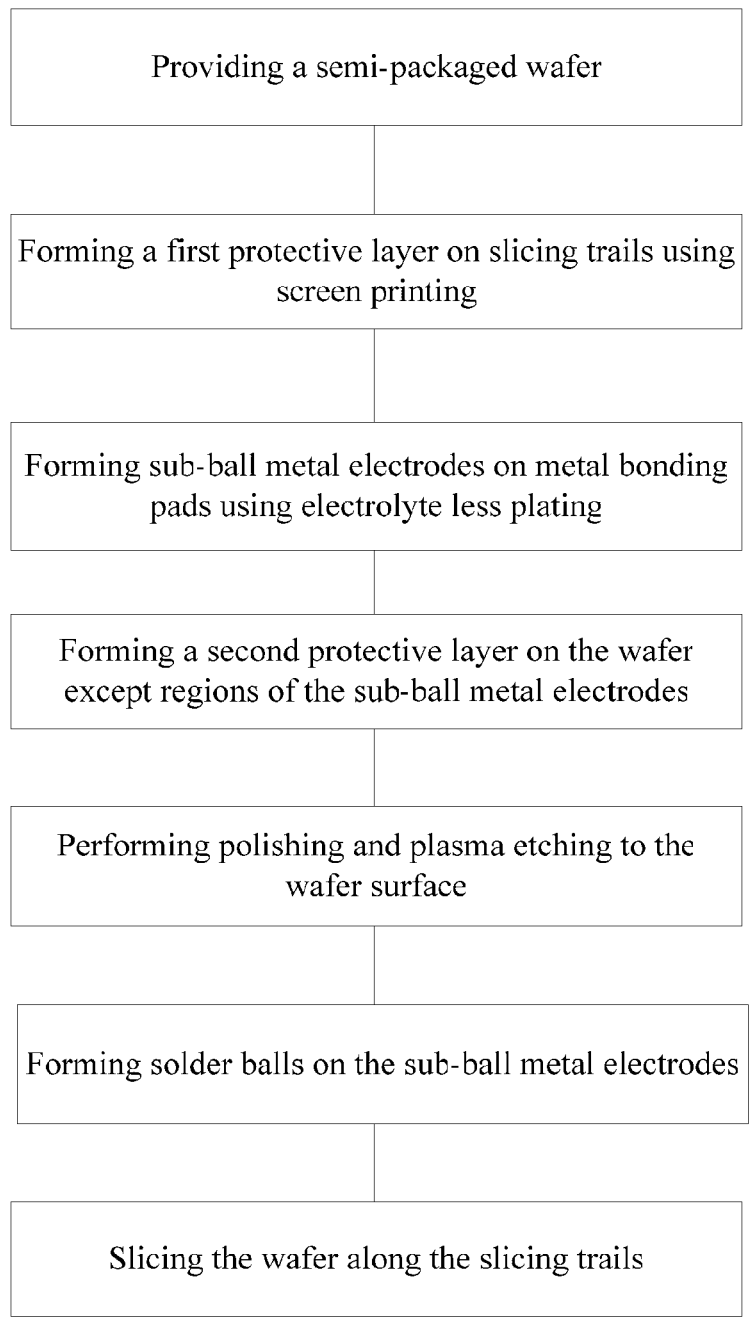
FIG. 17 schematically illustrates a flow chart of a packaging process according to a second exemplary embodiment of the present disclosure.
Figure 18:
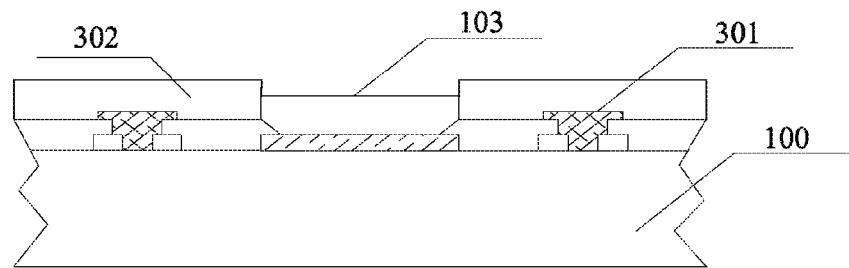
FIGS. 18 to 20 schematically illustrate cross-sectional views of intermediate structures formed in a process illustrated in FIG. 17.
Figure 19:
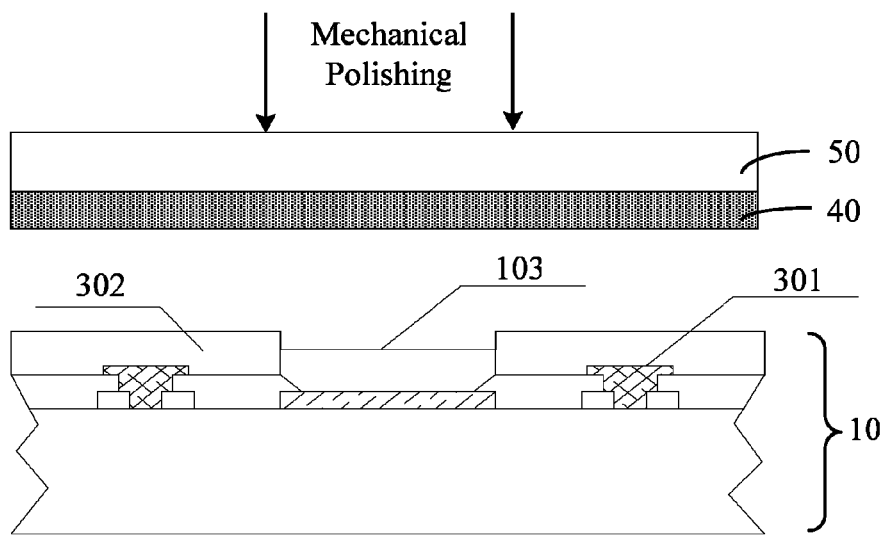
Figure 20:
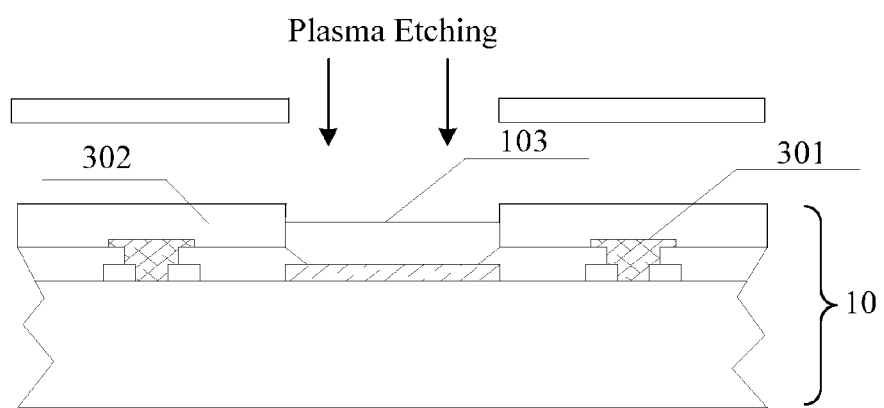

FIG. 17 schematically illustrates a flow chart of a packaging process according to a second exemplary embodiment of the present disclosure. FIGS. 18 to 20 schematically illustrate intermediate structures in the packaging process. Processing steps will be further illustrated with reference to FIG. 17.

Referring to FIG. 17, the processing steps in the second embodiment include: providing a semi-packaged wafer; printing a first protective layer on slicing trails using screen printing; forming sub-ball metal electrodes on metal bonding pads using electrolyte less plating; forming a second protective layer on the wafer surface except regions of the sub-ball metal electrodes; processing the wafer surface with polishing and plasma etching; forming solder balls on the sub-ball metal electrodes; and slicing the wafer along the slicing trails.

Compared with the processing steps of the first exemplary embodiment illustrated in FIG. 8, the second exemplary embodiment has following differences. After the sub-ball metal electrodes are formed using electrolyte less plating, the second exemplary embodiment further includes forming the second protective layer on the wafer surface except regions of the sub-ball metal electrodes, and other relevant processing steps. The second protective layer may further protect the wafer 10. Besides, in the subsequent step of forming the solder balls, it is not necessary to perform an underfill process, thereby simplifying the process. Furthermore, if the second protective layer is formed of dark resin (epoxy resin is a typical dark resin), chip circuit failure caused by photoelectric effect induced by external illumination may be avoided.

As shown in FIG. 18, based on the semi-packaged wafer structure illustrated in FIG. 14 according to the first exemplary embodiment, a second protective layer 302 is formed on the wafer 10 using screen printing.

Specifically, in order to reduce the cost, the second protective layer 302 is configured to have the same material as the first protective layer 301, such as thermosetting epoxy resin. However, deferent from the first protective layer filled into the slicing trails 200, the second protective layer 302 is a thin film with a thickness of about 5 µm to about 50 µm. During the screen printing, the fluidity of the thermosetting epoxy resin should be maintained, i.e., the temperature of the wafer 10 needs to be kept below the curing temperature of the thermosetting epoxy resin, so as to ensure that the second protective layer 302 may have an ideal uniformity.

To obtain detail information of the screen printing process, please refer to the formation of the first protective layer 301 illustrated in FIG. 13. Optionally, the printing plate 20 may have an altered pattern to coat the surface of the wafer 10 except the regions of the sub-ball metal electrodes 103 with the liquid thermosetting epoxy resin. Thereafter, the wafer is heated to solidify the resin to form the second protective layer 302.

In some embodiment, the curing temperature of the epoxy resin is configured to below 200° C. to simplify the process. Normally, the epoxy resin further includes a curing filler to improve the curing characteristic, such as silicon dioxide particles or other solid particles. The particles may have a particle diameter less than ⅓ of the printing thickness, so as to fulfill the requirements of uniformity and flatness of the thin film printing process, and thus reducing warping of the wafer 10. The printing thickness may be adjusted by controlling the resin's thickness on the printing plate 20. In some embodiments, during the screen printing, the printing thickness of the liquid epoxy resin is about 15 µm, the particle diameter is not larger than 5 µm, and the average thickness of the second protective layer 302 formed after the curing of the epoxy resin can be controlled within a range from about 11 µm to about 12 µm.

Due to the fluidity of the liquid epoxy resin in the screen printing, the resin may be likely to leak into the regions of the sub-ball metal electrodes 103, which may cause problems. During the formation of the solder balls on top of the sub-ball metal electrodes 103, the epoxy resin disposed on the sub-ball metal electrodes 103 reduces the contact area of the solder balls and the sub-ball metal electrodes 103. Therefore, the conjunction between the solder balls and the sub-ball metal electrodes 103 may be weakened. The solder balls may even peel from the sub-ball metal electrodes in a subsequent reliability test and substrate drop test, which may cause adverse effects. Therefore, after the formation of the second protective layer 302, a polishing process is normally performed to the wafer 10's surface to remove the above-described residues.

The polishing process may be a chemical or mechanical polishing process. As shown in FIG. 19, in some embodiments, the polishing process includes: placing the wafer 10 on a fixed operating platform; winding a non-woven 40 softer than the wafer around a polishing head 50 and tightly attaching the non-woven 40 on the wafer 10's surface; and dipping the non-woven 40 with a polishing solution and performing a mechanical polishing, so as to remove the residues attached on the wafer 10's surface.

Optionally; after the polishing, as shown in FIG. 20, a plasma etching process may be performed to further remove the epoxy resin attached on top of the sub-ball metal electrodes 103. The plasma etching process applies an etching gas including oxygen, which may react with the cured epoxy resin and generates gas. Therefore, the residues are removed.

After the processing steps, the process may come to formation of solder balls, slicing and subsequent steps, which may be the same as the first embodiment and may not illustrated in detail here.

Third Exemplary Embodiment

Figure 21:
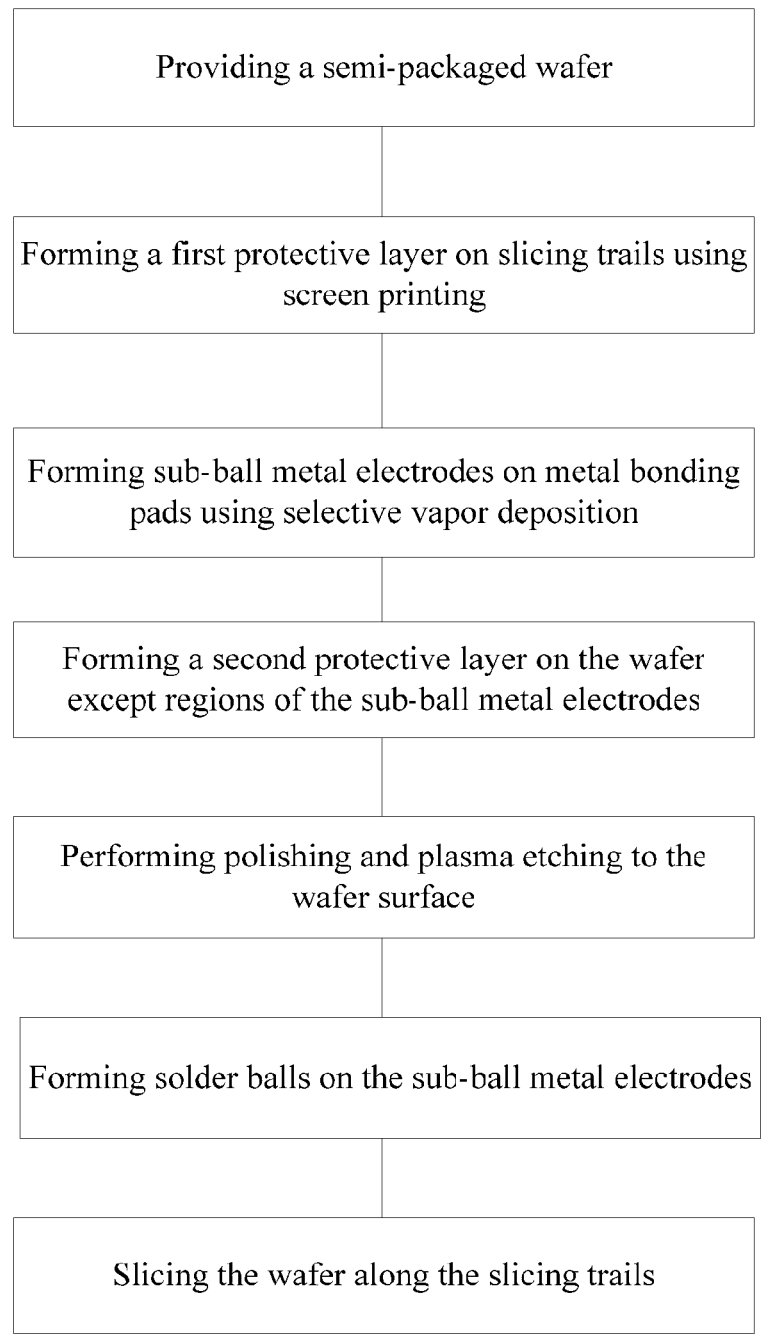
FIG. 21 schematically illustrates a flow chart of a packaging process according to a third exemplary embodiment of the present disclosure.
Figure 22:
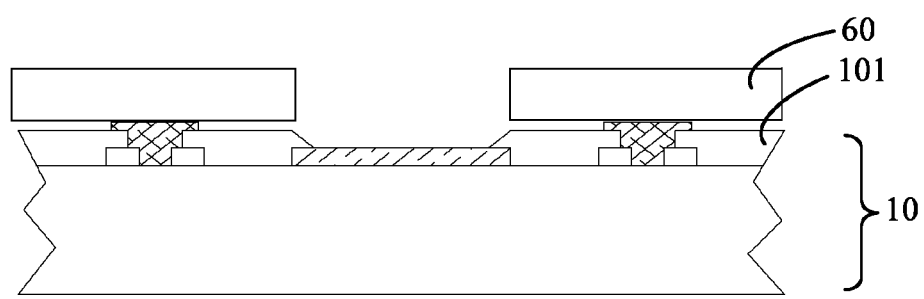
FIGS. 22 and 23 schematically illustrate cross-sectional views of intermediate structures formed in a process illustrated in FIG. 21.
Figure 23:
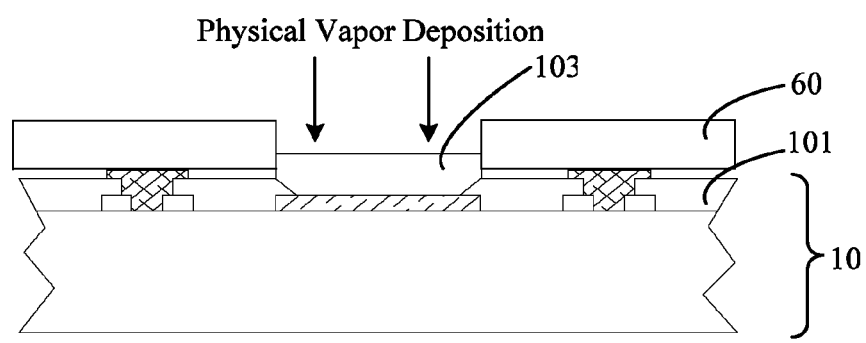

FIG. 21 schematically illustrates a flow chart of a packaging process according to a third exemplary embodiment of the present disclosure. FIGS. 22 and 23 are cross-sectional views illustrating processing steps of FIG. 21. Detail descriptions will be made with reference to FIG. 21.

Referring to FIG. 21, the third embodiment includes processing steps of: providing a semi-packaged wafer; printing a first protective layer on slicing trails using screen printing; forming sub-ball metal electrodes on metal bonding pads using selective vapor deposition; forming a second protective layer on a surface of the wafer except regions of the sub-ball metal electrodes; performing a polishing and plasma etching process to the wafer surface; forming solder balls on the sub-ball metal electrodes; and slicing the wafer along the slicing trails.

Compared with the processing steps illustrated in FIGS. 8 and 17, the third exemplary embodiment has a different way of forming sub-ball metal electrodes. Specifically, the sub-ball metal electrodes are formed at predefined positions on the wafer 10 using selective vapor deposition instead of electrolyte less plating.

As shown in FIG. 22, based on the semi-packaged wafer structure of the first exemplary embodiment illustrated in FIG. 11, a mask plate 60 is disposed on the wafer 10. The mask plate 60 may be a metal mask plate tightly attached onto the wafer 10, with openings formed therein. The openings of the mask plate 60 are aligned with the openings of the protective mask 101 on the wafer 10's surface.

In some embodiments, Ni and Cu are selected as the material of the sub-ball metal electrodes. As shown in FIG. 23, the wafer 10 and the mask plate 60 are disposed in a deposition chamber. Using physical vapor deposition, Ni and Cu are successively deposited, forming desired sub-ball metal electrodes 103. Due to the existence of the mask plate 60, the metal described above may only be deposited into the openings of the protective mask 101, i.e., predefined positions of the sub-ball metal electrodes 103, thereby realizing the selective vapor deposition. The mask plate 60 can be repeatedly used, which may be more economic compared with electrolyte less plating. Besides, vapor deposition has advantages of fast speed and short process.

Subsequent processing steps are the same as above and may not be illustrated in detail here.

Furthermore, in some embodiments, before the screen printing, normally the processed wafer 10 may be baked or subjected to a facial activate plasma processing to enhance the adhesion of the thermosetting resin in the screen printing.

The invention is disclosed, but not limited, by preferred embodiments as above. Based on the disclosure of the invention, those skilled in the art can make any variation and modification without departing from the scope of the invention. Therefore, any simple modification, variation and polishing based on the embodiments described herein is within the scope of the present invention.

What is claimed is:

1. A method for chip packaging, comprising:
   providing a semi-packaged wafer, where the semi-packaged wafer comprises a semiconductor substrate with chips formed thereon and a protective mask on the semiconductor substrate to provide insulation and protection, the protective mask has openings exposing metal bonding pads of the chips, and the protective mask also has openings of slicing trails on the semiconductor substrate;
   forming a first protective layer in the slicing trails;
   forming sub-ball metal electrodes on the metal bonding pads;
   forming a second protective layer on portions of the wafer without the sub-ball metal electrodes after the sub-ball metal electrodes are formed;
   forming solder balls on the sub-ball metal electrodes; and
   slicing the wafer along the slicing trails.

2. The method according to claim 1, wherein the first protective layer has a width larger than that of the slicing trails.

3. The method according to claim 2, wherein the width of the slicing trails ranges from about 30 μm to about 80 μm, and the width of the first protective layer ranges from about 50 μm to about 120 μm.

4. The method according to claim 1, wherein the first protective layer comprises thermosetting epoxy resin and is formed using a screen printing process.

5. The method according to claim 1, wherein the sub-ball metal electrodes are formed using an electrolyte less plating process.

6. The method according to claim 5, wherein the electrolyte less plating process comprises: washing a surface of the wafer with zincate; and electrolyte less plating Ni and Au on the wafer successively.

7. The method according to claim 6, wherein Ni has an electroplating thickness of about 3 μm, and Au has an electroplating thickness of about 0.05 μm.

8. The method according to claim 1, wherein the sub-ball metal electrodes are formed using a selective vapor deposition process.

9. The method according to claim 8, wherein the selective vapor deposition comprises:
   disposing a mask plate on the wafer, where the mask plate exposes positions on the wafer where the sub-ball metal electrodes are to be formed; and depositing Ni and Cu successively on the wafer using a physical vapor deposition process with the mask plate as a mask.

10. The method according to claim 1, wherein the second protective layer has a thickness ranging from about 5 μm to about 50 μm.

11. The method according to claim 1, wherein the second protective layer comprises thermosetting epoxy resin and is formed using a screen printing process.

12. The method according to claim 1, further comprising: after the second protective layer is formed, performing a polishing process to the wafer.

13. The method according to claim 12, wherein the polishing process comprises:
   placing the wafer on a fixed operating platform;
   winding a non-woven softer than the wafer around a polishing head, and tightly attaching the non-woven onto the wafer; and
   dipping the non-woven with a polishing solution and mechanically polishing the wafer.

14. The method according to claim 11, further comprising: after the second protective layer is formed, removing the thermosetting epoxy resin on top of the sub-ball metal electrodes using a plasma etching process.

15. The method according to claim 11, wherein the wafer is maintained at a temperature lower than a curing temperature of the thermosetting epoxy resin during the screen printing process.

16. The method according to claim 11, wherein the curing temperature of the thermosetting epoxy resin is less than 200° C.

17. The method according to claim 16, wherein the thermosetting epoxy resin comprises a solidified filler having particles with a particle diameter less than ⅓ of a printing thickness of the thermosetting epoxy resin.

18. The method according to claim 17, wherein the printing thickness of the thermosetting epoxy resin is about 15 μm, the particle diameter of the solidified fillers is less than about 5 μm, and the second protective layer formed after the curing has an average thickness ranging from about 11 μm to about 12 μm.

19. The method according to claim 4, wherein the wafer is subjected to a baking process or a plasma processing process to activate the surface of the wafer before the screen printing process.

20. The method according to claim 11, wherein the wafer is subjected to a baking process or a plasma processing process to activate the surface of the wafer before the screen printing process.

* * * * *

UNITED STATES PATENT AND TRADEMARK OFFICE
CERTIFICATE OF CORRECTION

| | | |
|---|---|---|
| PATENT NO. | : 8,883,627 B2 | Page 1 of 1 |
| APPLICATION NO. | : 13/883231 | |
| DATED | : November 11, 2014 | |
| INVENTOR(S) | : Lei Shi | |

It is certified that error appears in the above-identified patent and that said Letters Patent is hereby corrected as shown below:

In the Specification:

In Column 1, line 8, please delete "May 19, 2011" and replace therewith --October 18, 2011--.

Signed and Sealed this
Eighth Day of September, 2015

Michelle K. Lee
*Director of the United States Patent and Trademark Office*

UNITED STATES PATENT AND TRADEMARK OFFICE
CERTIFICATE OF CORRECTION

| | | |
|---|---|---|
| PATENT NO. | : 8,883,627 B2 | Page 1 of 1 |
| APPLICATION NO. | : 13/883231 | |
| DATED | : November 11, 2014 | |
| INVENTOR(S) | : Lei Shi et al. | |

It is certified that error appears in the above-identified patent and that said Letters Patent is hereby corrected as shown below:

In the Specification:

In Column 1, line 8, please delete "May 19, 2011" and replace therewith --October 18, 2011--.

This certificate supersedes the Certificate of Correction issued September 8, 2015.

Signed and Sealed this
Twelfth Day of January, 2016

Michelle K. Lee
*Director of the United States Patent and Trademark Office*